(12) United States Patent
Kasahara et al.

(10) Patent No.: US 10,096,539 B2
(45) Date of Patent: Oct. 9, 2018

(54) LEAD FRAME AND ELECTRONIC COMPONENT DEVICE

(71) Applicant: SHINKO ELECTRIC INDUSTRIES CO., LTD., Nagano-shi, Nagano (JP)

(72) Inventors: Tetsuichiro Kasahara, Nagano (JP); Naoya Sakai, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/701,507

(22) Filed: Sep. 12, 2017

(65) Prior Publication Data

US 2018/0082931 A1  Mar. 22, 2018

(30) Foreign Application Priority Data

Sep. 16, 2016 (JP) .................................. 2016-181178

(51) Int. Cl.
*H01L 29/49* (2006.01)
*H01L 23/495* (2006.01)
*H01L 23/31* (2006.01)

(52) U.S. Cl.
CPC .... *H01L 23/49541* (2013.01); *H01L 23/3121* (2013.01); *H01L 23/49558* (2013.01)

(58) Field of Classification Search
CPC ........... H01L 23/49541; H01L 23/3121; H01L 23/49558
See application file for complete search history.

(56) References Cited

U.S. PATENT DOCUMENTS

| | | | |
|---|---|---|---|
| 2012/0001306 A1* | 1/2012 | Wang | H01L 21/4832 257/666 |
| 2013/0221509 A1* | 8/2013 | Oda | H01L 24/97 257/676 |
| 2015/0302291 A1* | 10/2015 | Gotou | G06K 19/07754 29/601 |
| 2016/0099210 A1* | 4/2016 | Kwon | H01L 21/76829 257/774 |
| 2017/0125631 A1* | 5/2017 | Lee | H01L 33/06 |
| 2017/0236981 A1* | 8/2017 | Nakabayashi | H01L 33/486 438/29 |
| 2017/0271254 A1* | 9/2017 | Fontana | H01L 23/3677 |
| 2018/0082931 A1* | 3/2018 | Kasahara | H01L 23/3121 |

FOREIGN PATENT DOCUMENTS

JP 7-58270 3/1995

* cited by examiner

*Primary Examiner* — Michael Shingleton
(74) *Attorney, Agent, or Firm* — Rankin, Hill & Clark LLP

(57) ABSTRACT

A lead frame includes: a resin portion including an upper surface and a lower surface opposite to the upper surface; and a first terminal formed to penetrate the resin portion. The first terminal includes: a first upper terminal portion disposed to protrude from the upper surface; a first lower terminal portion disposed on the first upper terminal portion to protrude from the lower surface; a first through hole formed in one of the first upper terminal portion and the first lower terminal portion; a first recess defined by an inner wall surface of the first through hole and a surface of the other of the first upper terminal portion and the first lower terminal portion; and a first metal layer formed on an inner surface of the first recess.

11 Claims, 24 Drawing Sheets

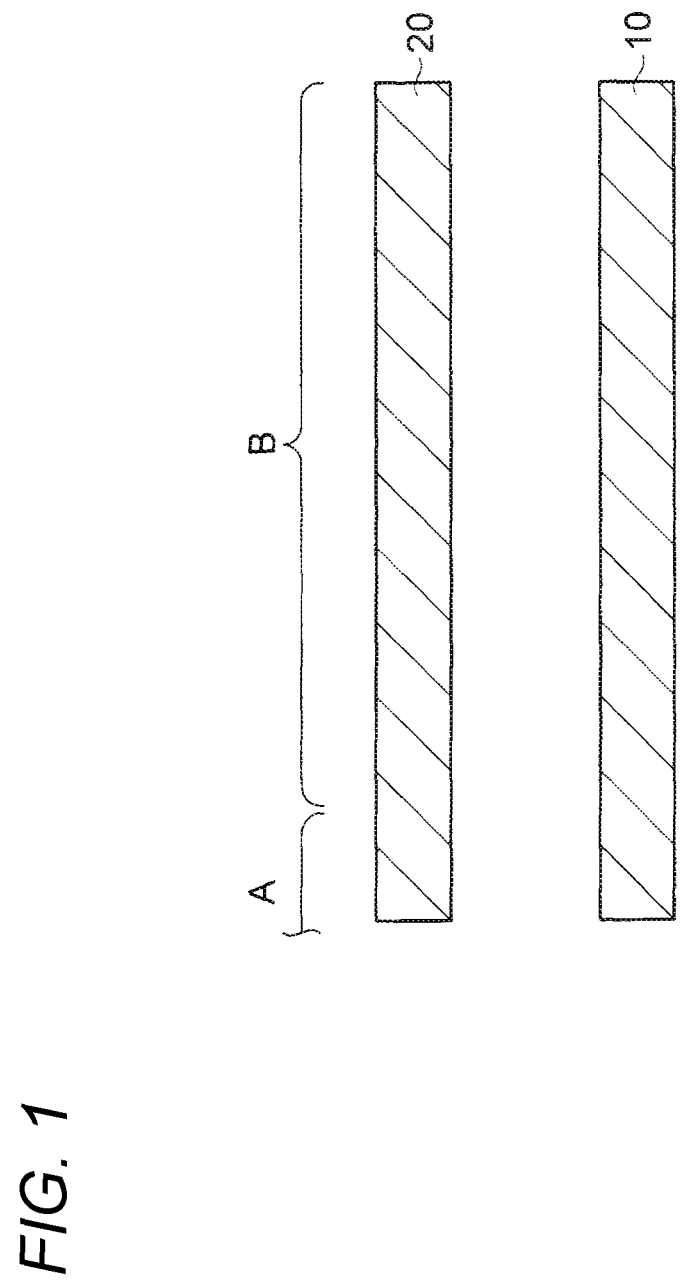

FIG. 3
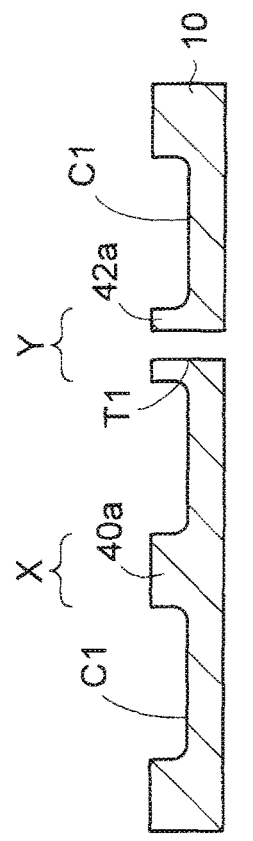
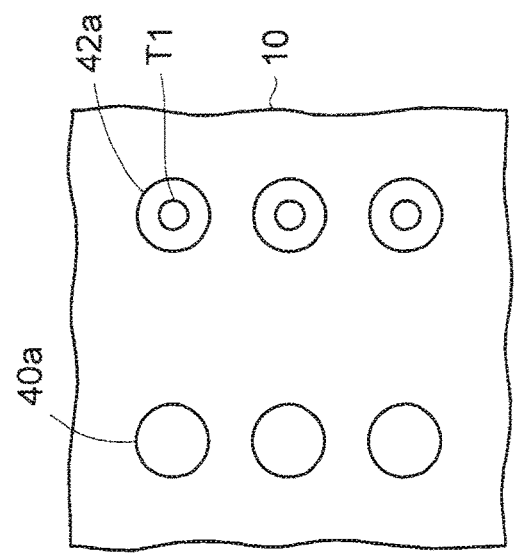

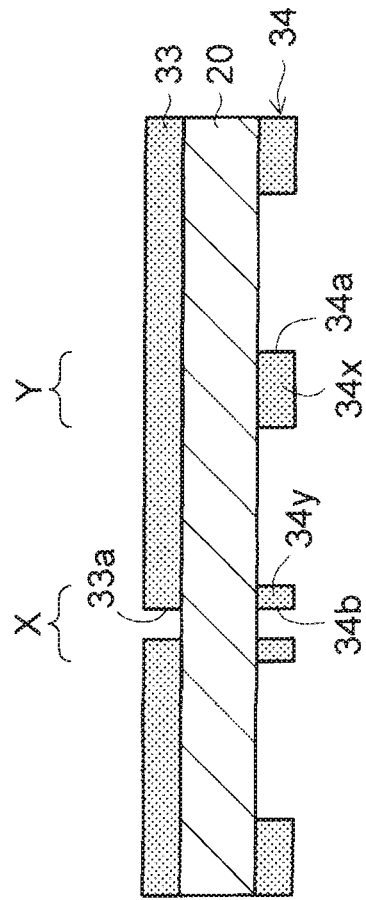
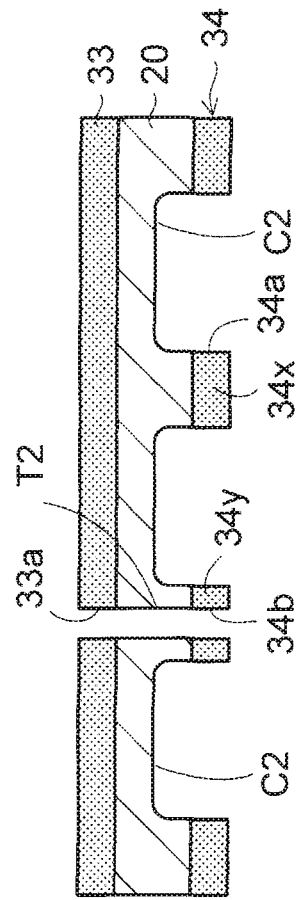
FIG. 4A
FIG. 4B

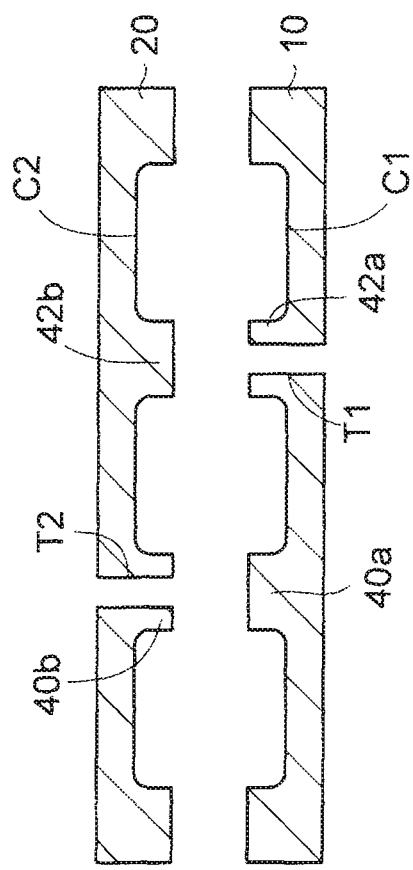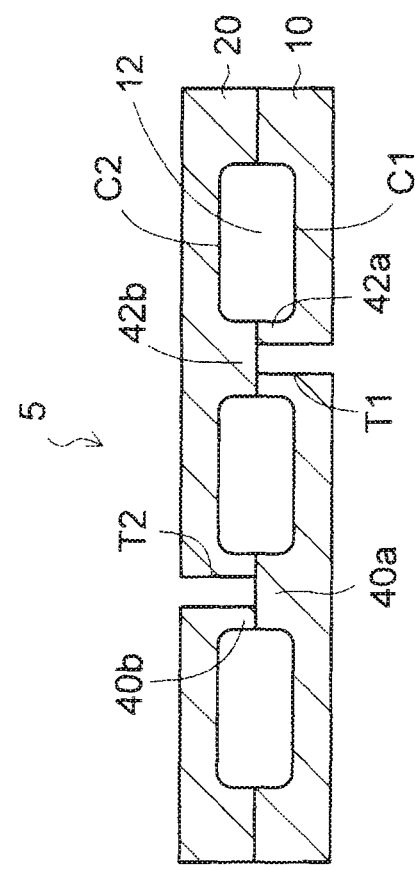
FIG. 6A
FIG. 6B

LEAD FRAME AND ELECTRONIC COMPONENT DEVICE

This application claims priority from Japanese Patent Application No. 2016-181178, filed on Sep. 16, 2016, the entire contents of which are herein incorporated by reference.

BACKGROUND

1. Technical Field

The present disclosure relates to a lead frame and an electronic component device.

2. Background Art

In the background art, there are lead frames for mounting electronic components such as semiconductor chips. In such a lead frame, a semiconductor chip mounted on a die pad is connected to ambient leads through wires, and the semiconductor chip and the wires are sealed with a sealing resin (see e.g., JP-A-7-58270).

Recently, the lead frame has been required to have a larger number of pins and a narrower pitch to miniaturize the semiconductor chip. To satisfy this requirement, it is necessary to etch a thinner metal plate for manufacturing the lead frame. However, there is a problem that failure such as deformation of a wiring layer may be apt to occur.

SUMMARY

According to one or more aspects of the present disclosure, there is provided a lead frame.

The lead frame comprises:
a resin portion comprising an upper surface and a lower surface opposite to the upper surface; and
a first terminal formed to penetrate the resin portion.

The first terminal comprises:
a first upper terminal portion disposed to protrude from the upper surface;
a first lower terminal portion disposed on the first upper terminal portion to protrude from the lower surface;
a first through hole formed in one of the first upper terminal portion and the first lower terminal portion;
a first recess defined by an inner wall surface of the first through hole and a surface of the other of the first upper terminal portion and the first lower terminal portion; and
a first metal layer formed on an inner surface of the first recess.

According to one or more aspects of the present disclosure, there is provided an electronic component device.

The electronic component device comprises:
a lead frame comprising:
a resin portion comprising an upper surface and a lower surface opposite to the upper surface; and
a first terminal formed to penetrate the resin portion;
wherein the first terminal comprises:
a first upper terminal portion disposed to protrude from the upper surface;
a first lower terminal portion disposed on the first upper terminal portion to protrude from the lower surface;
a first through hole formed in one of the first upper terminal portion and the first lower terminal portion;
a first recess defined by an inner wall surface of the first through hole and a surface of the other of the first upper terminal portion and the first lower terminal portion; and
a first metal layer formed on an inner surface of the first recess, and
an electronic component mounted on the lead frame to be electrically connected to the first terminal.

BRIEF DESCRIPTION OF DRAWINGS

FIG. 1 is a sectional view (Part 1) showing a manufacturing method for a lead frame according to a first embodiment;

FIG. 3 is a sectional view and a plan view (Part 3) showing the manufacturing method for the lead frame according to the first embodiment;

FIGS. 4A and 4B are sectional views (Part 4) showing the manufacturing method for the lead frame according to the first embodiment;

FIGS. 6A and 6B are sectional views (Part 6) showing the manufacturing method for the lead frame according to the first embodiment;

DETAILED DESCRIPTION

Embodiments will be described below with reference to the accompanying drawings.

First Embodiment

Figure 14:
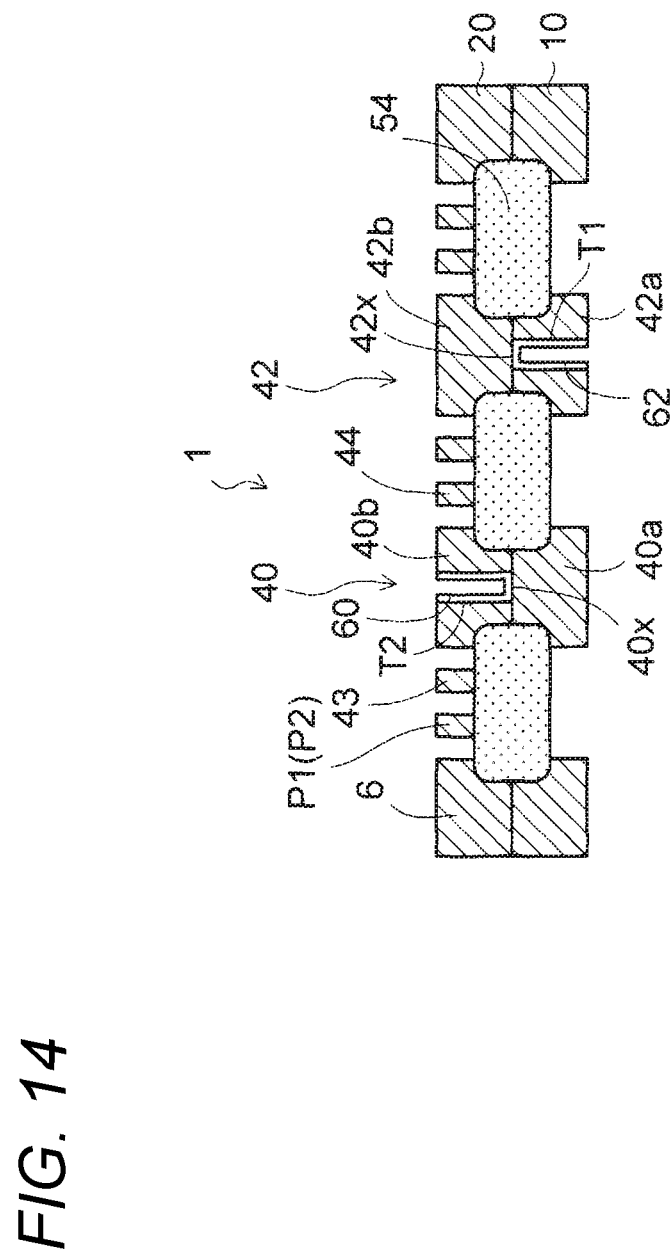
FIG. 14 is a sectional view showing the lead frame according to the first embodiment.
Figure 15:
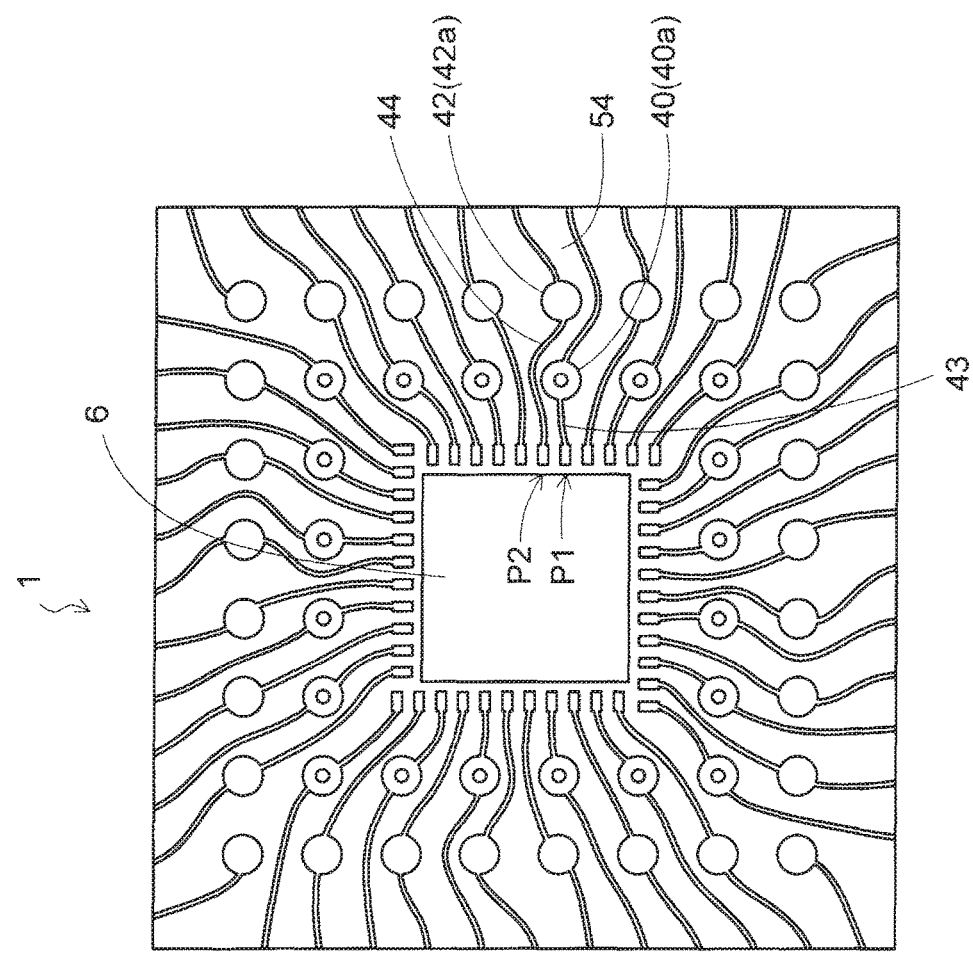
FIG. 15 is a plan view (Part 1) showing the lead frame according to the first embodiment.
Figure 16:
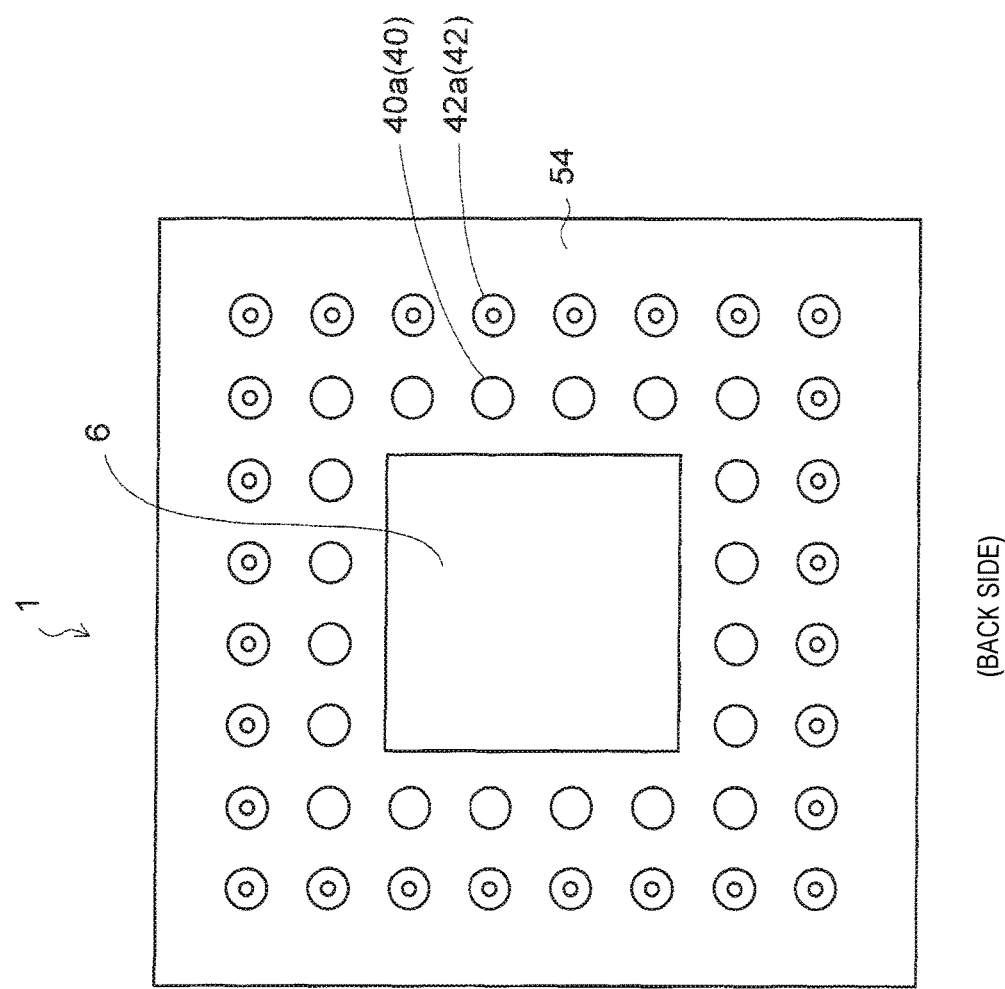
FIG. 16 is a plan view (Part 2) showing the lead frame according to the first embodiment.
Figure 17:
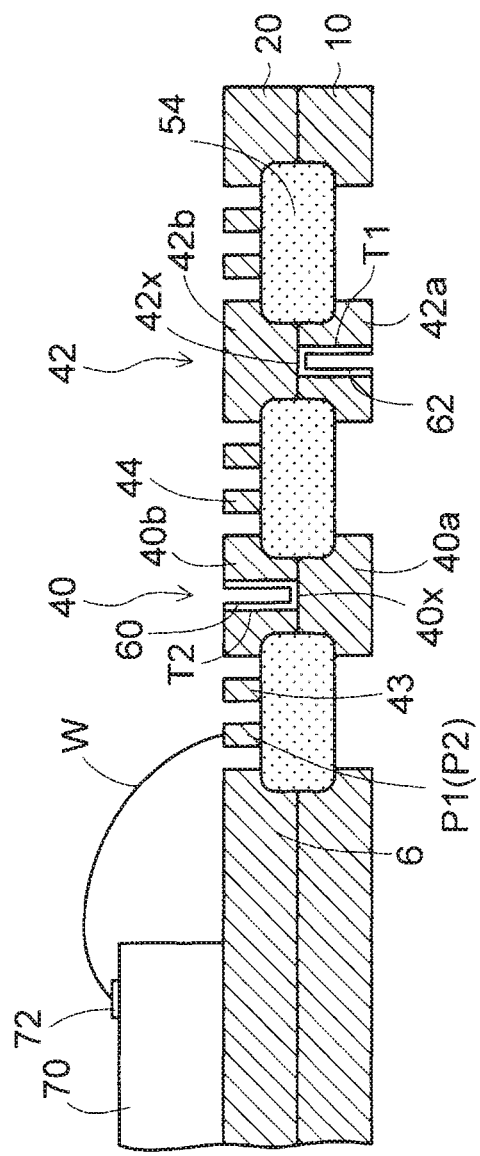
FIG. 17 is a sectional view showing a manufacturing method for an electronic component device using the lead frame shown in FIG. 14.
Figure 18:
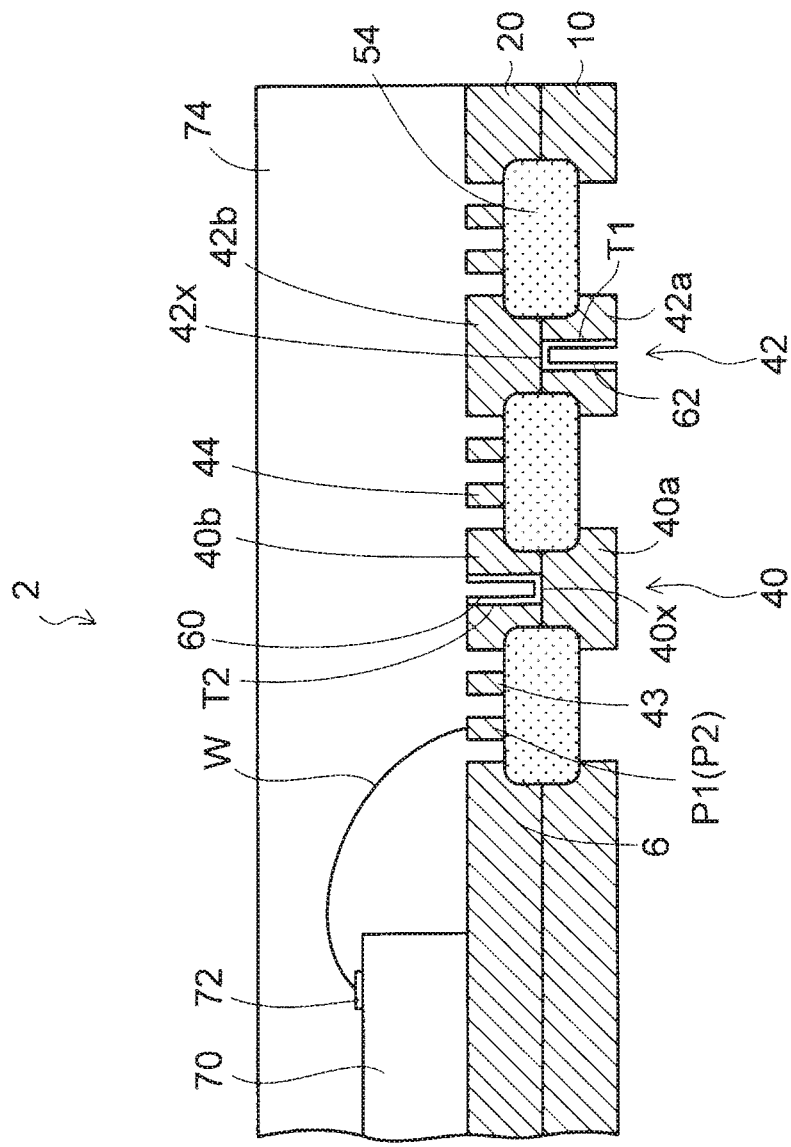
FIG. 18 is a sectional view (Part 1) showing the electronic component device according to the first embodiment.
Figure 19:
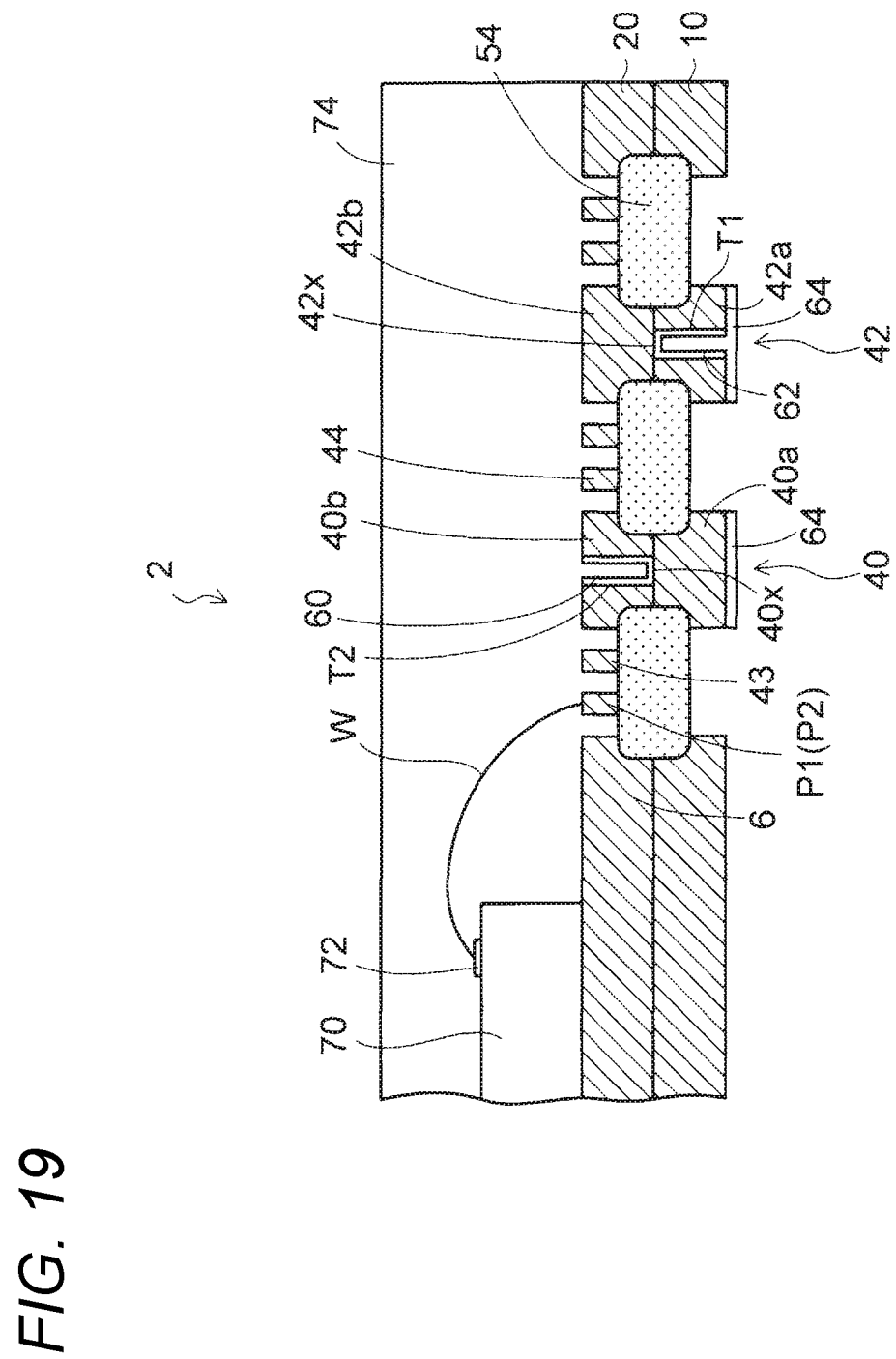
FIG. 19 is a sectional view (Part 2) showing the electronic component device according to the first embodiment.

FIG. 1, FIGS. 2A and 2B, FIG. 3, FIGS. 4A and 4B, FIG. 5, FIGS. 6A and 6B, and FIG. 7 to 13 are views for explaining a manufacturing method for a lead frame according to a first embodiment. FIGS. 14 to 16 are views showing the lead frame according to the first embodiment. FIGS. 17 to 19 are views for explaining an electronic component device according to the first embodiment.

The structure of the lead frame and the structure of the electronic component device will be described below while the manufacturing method for the lead frame and the electronic component device is described.

In the manufacturing method for the lead frame according to the first embodiment, first, a lower metal plate 10 disposed on a lower side and an upper metal plate 20 disposed on an upper side are prepared, as shown in FIG. 1.

As an example of each of the lower metal plate 10 and the upper metal plate 20, a copper plate made of a copper alloy is used. Alternatively, various metal plates of 42 Alloy (42% nickel (Ni)-iron (Fe)) etc. can be used as long as they can be used as lead frames. The thickness of the metal plate 10 is, for example, about 100 μm.

A die pad formation region A and a wiring formation region B surrounding the die pad formation region A are defined in one product region of the metal plate 10. A peripheral portion of the die pad formation region A and the wiring formation region B are shown in FIG. 1.

Figures 2A, 2B:
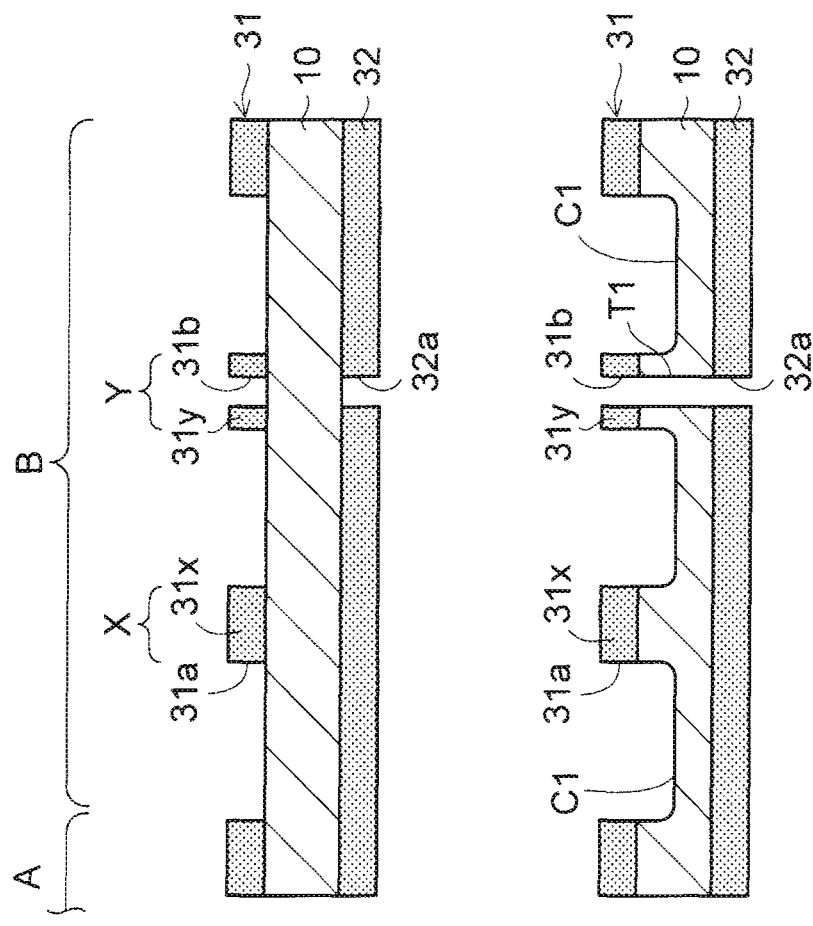
FIGS. 2A and 2B are sectional views (Part 2) showing the manufacturing method for the lead frame according to the first embodiment.

Next, as shown in FIG. 2A, a first resist layer 31 provided with a first opening portion 31a and second opening portions 31b is formed on an upper surface of the lower metal plate 10 based on photolithography. In addition, in the same manner, a second resist layer 32 provided with opening portions 32a is formed on a lower surface of the lower metal plate 10 based on photolithography.

In the lead frame according to the embodiment, a plurality of terminals through which electricity can be conducted between the upper surface side and the lower surface side are disposed in the wiring formation region B, and the terminals are formed to be connected to wiring portions and pads.

As shown in FIG. 2A, individual island-shaped patterns 31x of the first resist layer 31 are disposed in a first terminal disposition region X in which a plurality of first terminals will be disposed on the upper surface of the lower metal plate 10. The first opening portion 31a is disposed around the island-shaped patterns 31x.

In addition, individual doughnut-shaped patterns 31y of the first resist layer 31 are disposed in a second terminal disposition region Y where a plurality of second terminals will be disposed on the upper surface of the lower metal plate 10. The second opening portions 31b are disposed at the centers of the doughnut-shaped patterns 31y of the first resist layer 31. The second terminal disposition region Y is disposed outside the first terminal disposition region X.

Further, the opening portions 32a of the second resist layer 32 formed on the lower surface of the lower metal plate 10 are disposed in the second terminal disposition region Y correspondingly to the opening portions 31b of the doughnut-shaped patterns 31y of the first resist layer 31.

Next, as shown in FIG. 2B, the lower metal plate 10 is wet-etched to the middle of its thickness from the opposite sides through the first and second opening portions 31a and 31b of the first resist layer 31 and the opening portions 32a of the second resist layer 32 on the opposite surface sides of the lower metal plate 10.

When the copper plate is used as the metal plate 10, a ferric chloride solution, a cupric chloride solution, or the like, is used as an aqueous etchant. A spray etching device is preferably used as an etching device.

Thus, the lower metal plate 10 is etched to the middle of its thickness from the upper surface side through the first opening portion 31a of the first resist layer 31. As a result, a first recess C1 is formed. Due to the second resist layer 32 which protects the lower surface of the lower metal plate 10, the lower metal plate 10 can be prevented from being etched from the lower surface side so that a bottom plate of the first recess C1 can stay behind.

When the thickness of the lower metal plate 10 is 100 μm, the depth of the first recess C1 is set at about 50 μm.

In addition, in the second terminal disposition region Y, the lower metal plate 10 is etched simultaneously from the opposite surface sides through the second opening portions 31b of the doughnut-shaped patterns 31y of the first resist layer 31 and the opening portions 32a of the second resist layer 32.

Thus, in the second terminal disposition region Y, the lower metal plate 10 is bored. As a result, through holes T1 are formed. The diameter of each of the through holes T1 is, for example, about 100 μm.

Then, as shown in FIG. 3, the first resist layer 31 and the second resist layer 32 are removed from the lower metal plate 10.

In the first terminal disposition region X of the lower metal plate 10, first lower terminal portions 40a which will serve as lower portions of the first terminals are formed by the first recess C1 formed on the upper surface side. As shown in a partial plan view in FIG. 3, each of the first lower terminal portions 40a is disposed and shaped like a circle in plan view.

In addition, in the second terminal disposition region Y of the lower metal plate 10, second lower terminal portions 42a which will serve as lower portions of the second terminals are formed by the first recess C1 formed on the upper surface side. As shown in the partial plan view in FIG. 3, each of the second lower terminal portions 42a is disposed and shaped like a doughnut in which the through hole T1 is disposed at the center in plan view.

Next, a machining method for the upper metal plate 20 will be described. As shown in FIG. 4A, a first resist layer 33 provided with first opening portions 33a is formed on an upper surface of the upper metal plate 20 based on photolithography. In addition, in the same manner, a second resist layer 34 provided with a first opening portion 34a and second opening portions 34b is formed on a lower surface of the upper metal plate 20 based on photolithography.

Individual island-shaped patterns 34x of the second resist layer 34 are disposed in the second terminal disposition region Y on the lower surface of the upper metal plate 20. The first opening portion 34a is disposed around the island-shaped patterns 34x.

In addition, individual doughnut-shaped patterns 34y of the second resist layer 34 are disposed in the first terminal disposition region X on the lower surface of the upper metal plate 20. The second opening portions 34b are disposed at the centers of the doughnut-shaped patterns 34y of the second resist layer 34.

Further, the opening portions 33a of the first resist layer 33 formed on the upper surface of the upper metal plate 20 are disposed in the first terminal disposition region X correspondingly to the second opening portions 34b of the doughnut-shaped patterns 34y of the second resist layer 34.

Next, as shown in FIG. 4B, the upper metal plate 20 is wet-etched to the middle of its thickness from the opposite sides through the opening portions 33a of the first resist layer 33 and the first and second opening portions 34a and 34b of the second resist layer 34 on the opposite surface sides of the upper metal plate 20.

Thus, the upper metal plate 20 is etched to the middle of its thickness from the lower surface side through the first opening portion 34a of the second resist layer 34. As a result, a second recess C2 is formed. Due to the first resist layer 33 which protects the upper surface of the upper metal plate 20, the upper metal plate 20 can be prevented from being etched from the upper surface side so that a bottom plate of the second recess C2 can stay behind.

When the thickness of the upper metal plate 20 is 100 µm, the depth of the second recess C2 is set at about 50 µm.

In addition, in the first terminal disposition region X, the upper metal plate 20 is etched simultaneously from the opposite surface sides through the opening portions 33a of the first resist layer 33 and the second opening portions 34b of the doughnut-shaped patterns 34y of the second resist layer 34.

Thus, in the first terminal disposition region X, the upper metal plate 20 is bored. As a result, through holes T2 are formed.

Figure 5:
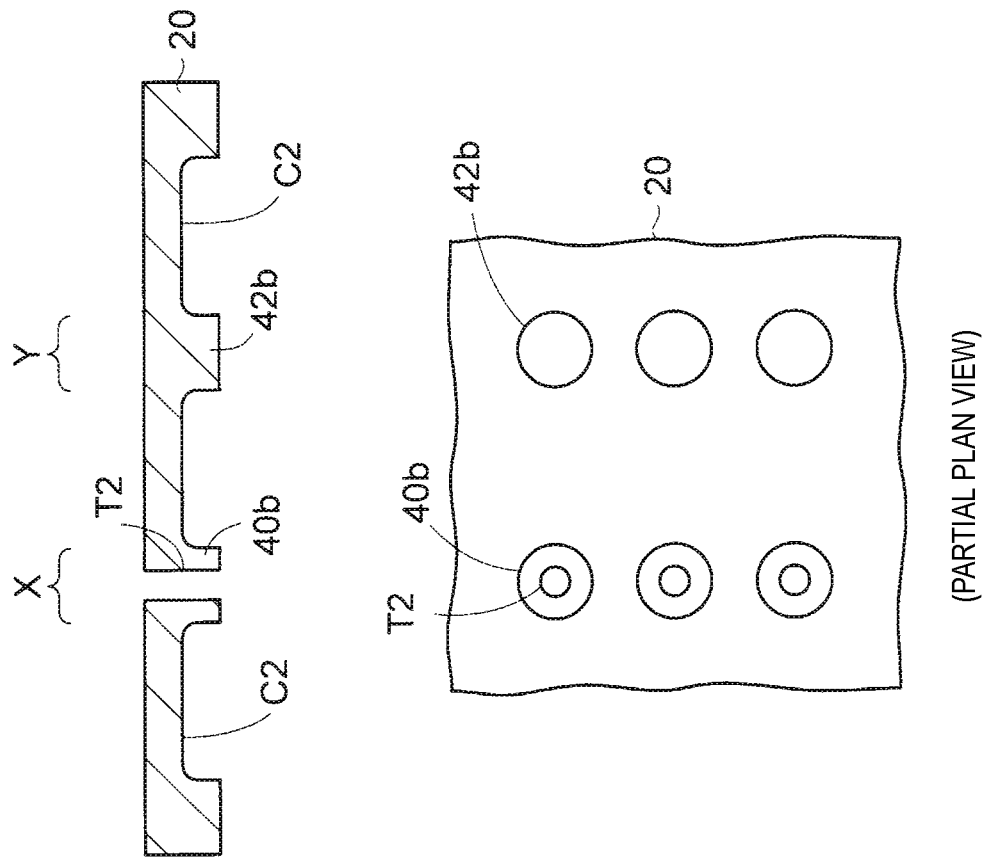
FIG. 5 is a sectional view and a plan view (Part 5) showing the manufacturing method for the lead frame according to the first embodiment.

Then, as shown in FIG. 5, the first resist layer 33 and the second resist layer 34 are removed from the upper metal plate 20.

In the second terminal disposition region Y of the upper metal plate 20, second upper terminal portions 42b which will serve as upper portions of the second terminals are formed by the second recess C2 formed on the lower surface side. As shown in a partial plan view in FIG. 5, each of the second upper terminal portions 42b is disposed and shaped like a circle in plan view.

The second upper terminal portions 42b of the upper metal plate 20 are disposed in positions corresponding to the aforementioned second lower terminal portions 42a of the lower metal plate 10.

In addition, in the first terminal disposition region X of the upper metal plate 20, first upper terminal portions 40b which will serve as upper portions of the first terminals are formed by the second recess C2 formed on the lower surface side. As shown in the partial plan view in FIG. 5, each of the first upper terminal portions 40b is disposed and shaped like a doughnut in which the through hole T2 is disposed at the center in plan view.

The first upper terminal portions 40b of the upper metal plate 20 are disposed in positions corresponding to the aforementioned first lower terminal portions 40a of the lower metal plate 10.

Next, as shown in FIG. 6A, the lower metal plate 10 shown in FIG. 3 and the upper metal plate 20 shown in FIG. 5 are prepared. As described above, each of the first lower terminal portions 40a of the lower metal plate 10 and each of the first upper terminal portions 40b of the upper metal plate 20 are disposed to face each other. In addition, in the same manner, each of the second lower terminal portions 42a of the lower metal plate 10 and each of the second upper terminal portions 42b of the upper metal plate 20 are disposed to face each other.

The first lower terminal portion 40a of the lower metal plate 10 and the first upper terminal portion 40b of the upper metal plate 20 are aligned with each other. In addition, at the same time, the second lower terminal portion 42a of the lower metal plate 10 and the second upper terminal portion 42b of the upper metal plate 20 are aligned with each other.

In this manner, as shown in FIG. 6B, the upper metal plate 20 is placed on the lower metal plate 10. Thus, the doughnut-shaped first upper terminal portion 40b of the upper metal plate 20 is disposed on the island-shaped first lower terminal portion 40a of the lower metal plate 10.

In addition, at the same time, the island-shaped second upper terminal portion 42b of the upper metal plate 20 is disposed on the doughnut-shaped second lower terminal portions 42a of the lower metal plate 10.

On this occasion, the upper metal plate 20 is disposed on the lower metal plate 10 without using a bonding member such as an adhesive agent.

Accordingly, in FIG. 6B, an upper surface of the first lower terminal portion 40a of the lower metal plate 10 and a lower surface of the first upper terminal portion 40b of the upper metal plate 20 have come into direct contact with each other. In addition, in the same manner, an upper surface of the second lower terminal portion 42a of the lower metal plate 10 and a lower surface of the second upper terminal portion 42b of the upper metal plate 20 have come into direct contact with each other.

Thus, a layered structure body 5 in which the upper metal plate 20 is placed on the lower metal plate 10 is obtained.

Inside the layered structure body 5, a cavity portion 12 is formed by the first recess C1 of the lower metal plate 10 and the second recess C2 of the upper metal plate 20.

Figure 7:
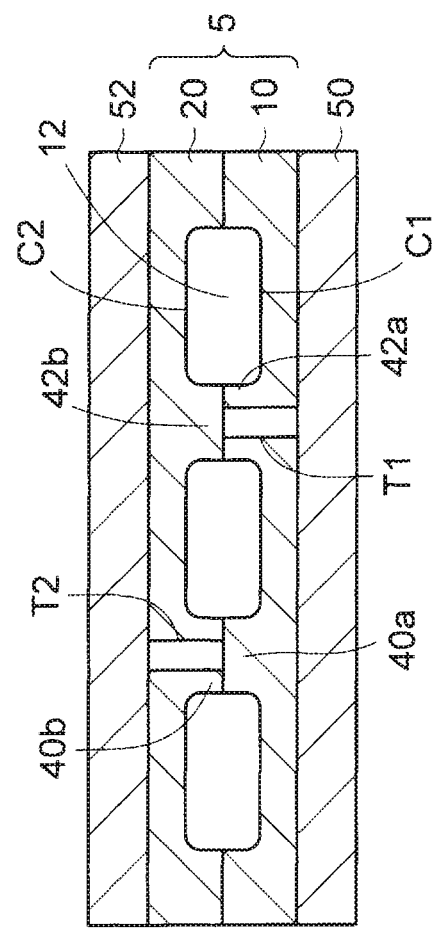
FIG. 7 is a sectional view (Part 7) showing the manufacturing method for the lead frame according to the first embodiment.
Figure 8:
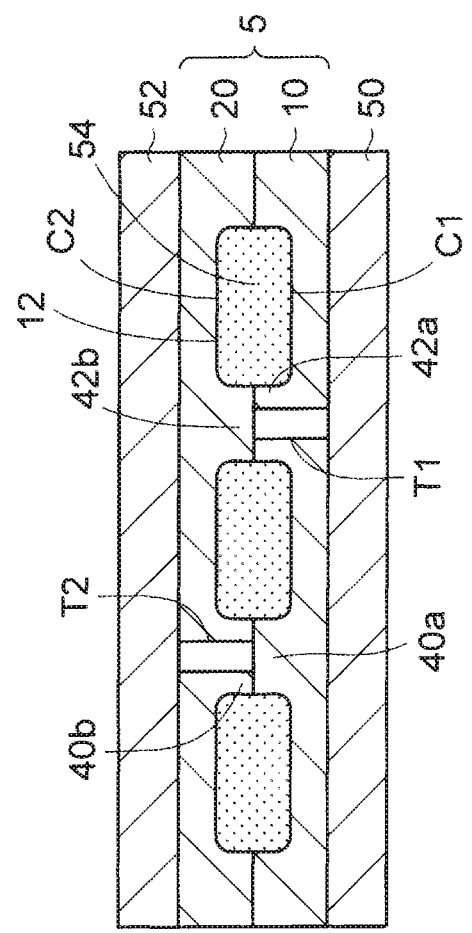
FIG. 8 is a sectional view (Part 8) showing the manufacturing method for the lead frame according to the first embodiment.

Successively, as shown in FIG. 7, the layered structure body 5 shown in FIG. 6 is disposed between a lower mold 50 and an upper mold 52. The layered structure body 5 is pressed by the lower mold 50 and the upper mold 52. Further, as shown in FIG. 8, a resin is filled in the cavity portion 12 of the layered structure body 5 through a gap between the lower mold 50 and the upper mold 52 by a transfer molding method. As a result, a resin portion 54 is formed. As a preferred example of the resin portion 54, a thermosetting epoxy resin etc. can be used.

Figure 9:
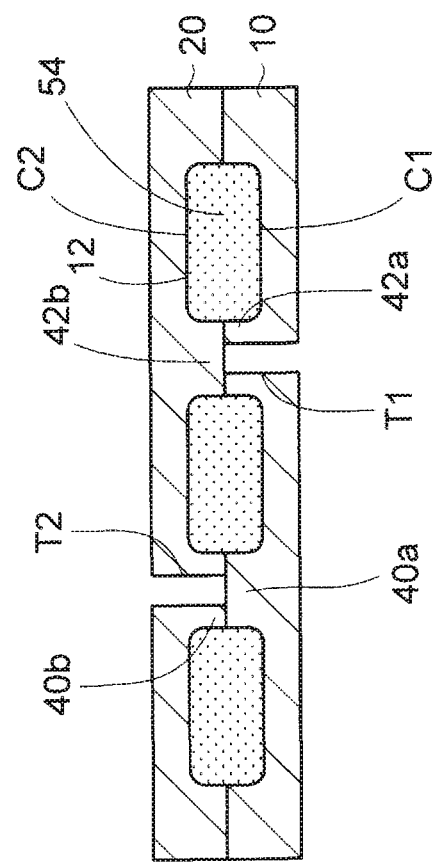
FIG. 9 is a sectional view (Part 9) showing the manufacturing method for the lead frame according to the first embodiment.

Then, as shown in FIG. 9, the lower mold 50 and the upper mold 52 are removed from the layered structure body 5. Thus, the lower metal plate 10 and the upper metal plate 20 are firmly fixed to and integrated with each other by the resin portion 54.

By employing such a method, stress can be prevented from being applied locally when the lower metal plate 10 and the upper metal plate 20 are firmly fixed to each other. Accordingly, the lead frame can be prevented from being deformed by residual stress.

Application of roughening treatment or blackening treatment (oxidation treatment) to both an inner surface of the first recess C1 of the lower metal plate 10 and an inner surface of the second recess C2 of the upper metal plate 20 is suitable for improvement of adhesion between the lead frame and the resin portion 54.

Here, the roughening treatment means treatment which gives unevenness to the surface of a metal to thereby improve adhesion between the metal and a resin due to an anchor effect.

On the other hand, the blackening treatment (oxidation treatment) means treatment which generates a chemical oxide film in the surface of a metal to thereby suppress generation of an unstable oxide film causing deterioration of adhesion between the metal and a resin.

Figure 10:
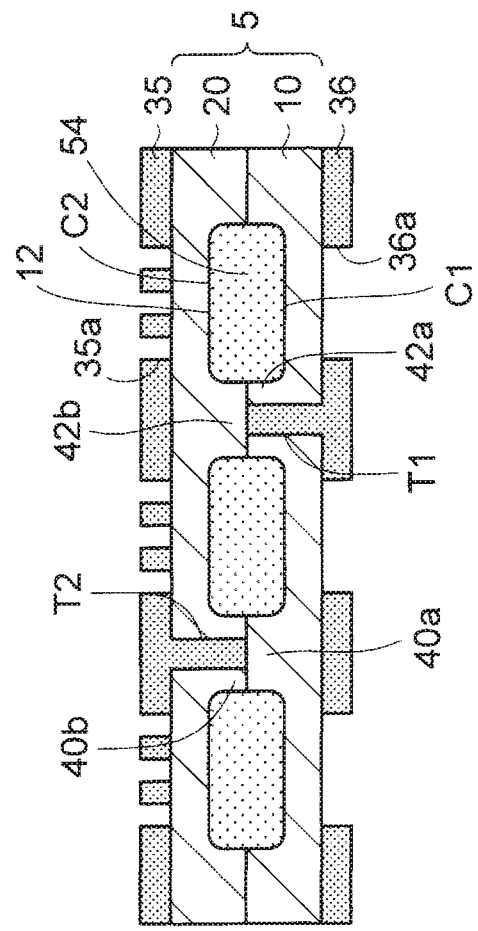
FIG. 10 is a sectional view (Part 10) showing the manufacturing method for the lead frame according to the first embodiment.

Next, as shown in FIG. 10, a first resist layer 35 provided with opening portions 35a is formed on the upper surface of the upper metal plate 20 of the layered structure body 5 shown in FIG. 9 based on photolithography.

Patterns of the first resist layer 35 are disposed so that the upper metal plate 20 can be patterned to obtain the first upper terminal portions 40b, the second upper terminal portions 42b, and the wiring portions and the pads connected to the first upper terminal portions 40b and the second upper terminal portions 42b.

In addition, a second resist layer 36 provided with opening portions 36a is formed on the lower surface of the lower metal plate 10 of the layered structure body 5 shown in FIG. 10 based on photolithography. Patterns of the second resist layer 36 are disposed so that the lower metal plate 10 can be patterned to obtain the first lower terminal portions 40a and the second lower terminal portions 42b separately.

Figure 11:
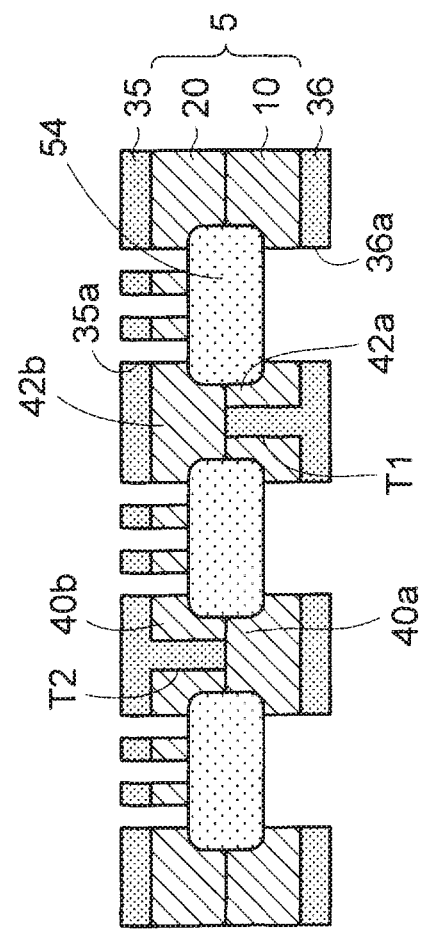
FIG. 11 is a sectional view (Part 11) showing the manufacturing method for the lead frame according to the first embodiment.

Successively, as shown in FIG. 11, the upper metal plate 20 of the layered structure body 5 is wet-etched from the upper surface side through the opening portions 35a of the first resist layer 35 until the resin portion 54 is exposed. In addition, at the same time, the lower metal plate 10 of the layered structure body 5 is wet-etched from the lower surface side through the opening portions 36a of the second resist layer 36 until the resin portion 54 is exposed.

In this manner, the lower metal plate 10 and the upper metal plate 20 are bored in the thickness direction to be patterned. Then, the first resist layer 35 and the second resist layer 36 are removed.

Figure 12:
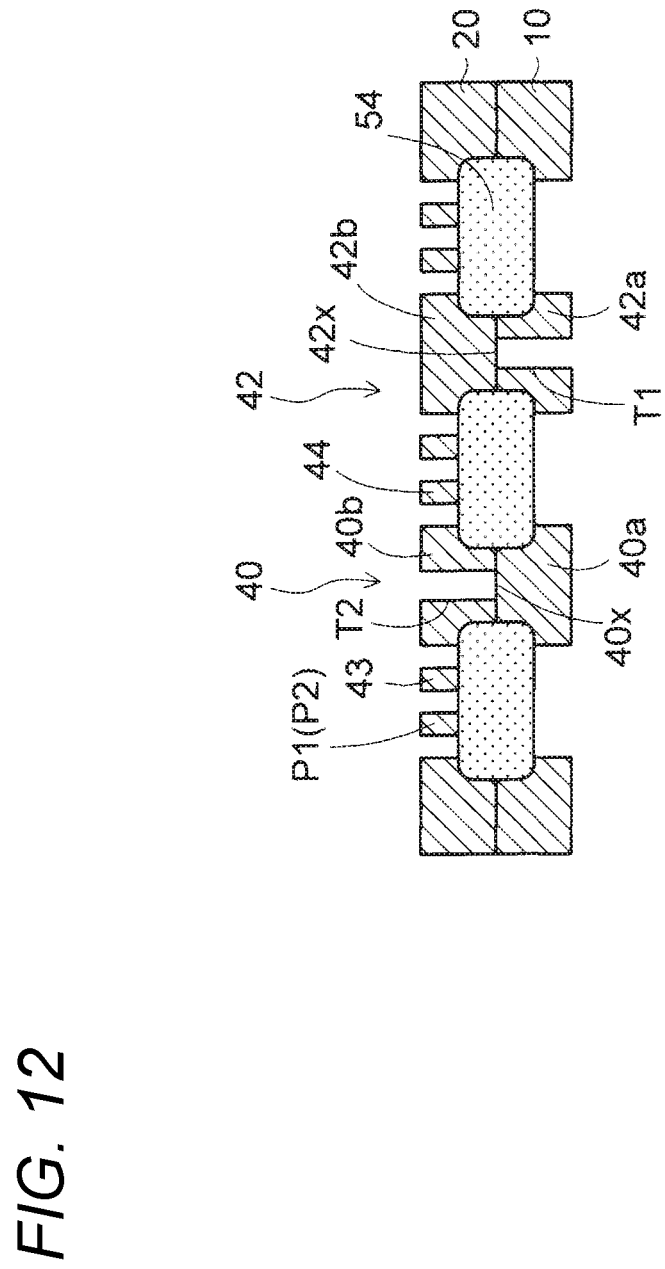
FIG. 12 is a sectional view (Part 12) showing the manufacturing method for the lead frame according to the first embodiment.

Thus, as shown in FIG. 12, the upper metal plate 20 is patterned. As a result, the first upper terminal portions 40b, and first wiring portions 43 and first pads P1 which are connected to the first upper terminal portions 40b are formed in the upper metal plate 20 (see a plan view of FIG. 15 which will be described later). In addition, at the same time, the upper metal plate 20 is patterned. As a result, the second upper terminal portions 42b, and second wiring portions 44 and second pads P2 which are connected to the second upper terminal portions 42b are formed in the upper metal plate 20 (see the plan view of FIG. 15 which will be described later).

In addition, the lower metal plate 10 is patterned. As a result, the first lower terminal portions 40a and the second lower terminal portions 42a are disposed in the lower metal plate 10 separately.

Each of the first terminals 40 is formed by a corresponding one of the first lower terminal portions 40a, and a corresponding one of the first upper terminal portions 40b which is disposed on the first lower terminal portion 40a. The first terminal 40 formed thus is connected to a corresponding one of the first wiring portions 43 and a corresponding one of the first pads P1.

In the first terminal 40, the through hole T2 of the first upper terminal portion 40b is disposed on the upper surface of the first lower terminal portion 40a. Thus, a recess 40x is formed by the through hole T2 of the first upper terminal portion 40b and the upper surface of the first lower terminal portion 40a.

Thus, the first terminal 40 is provided with the recess 40x which is formed at the center of the first terminal 40 on the upper surface side so as to extend to the middle of the height of the first terminal 40.

In addition, in the same manner, each of the second terminals 42 is formed by a corresponding one of the second lower terminal portions 42a and a corresponding one of the second upper terminal portions 42b which is disposed on the second lower terminal portion 42a. The second terminal 42 formed thus is connected to a corresponding one of the second wiring portions 44 and a corresponding one of the second pads P2.

In the second terminal 42, the through hole T1 of the second lower terminal portion 42a is disposed on the lower surface of the second upper terminal portion 42b. Thus, a recess 42x is formed by the through hole T1 of the second lower terminal portion 42a and the lower surface of the second upper terminal portion 42b.

Thus, the second terminal 42 is provided with the recess 42x which is formed at the center of the second terminal 42 on the lower surface side to extend to the middle of the height of the second terminal 42.

Figure 13:
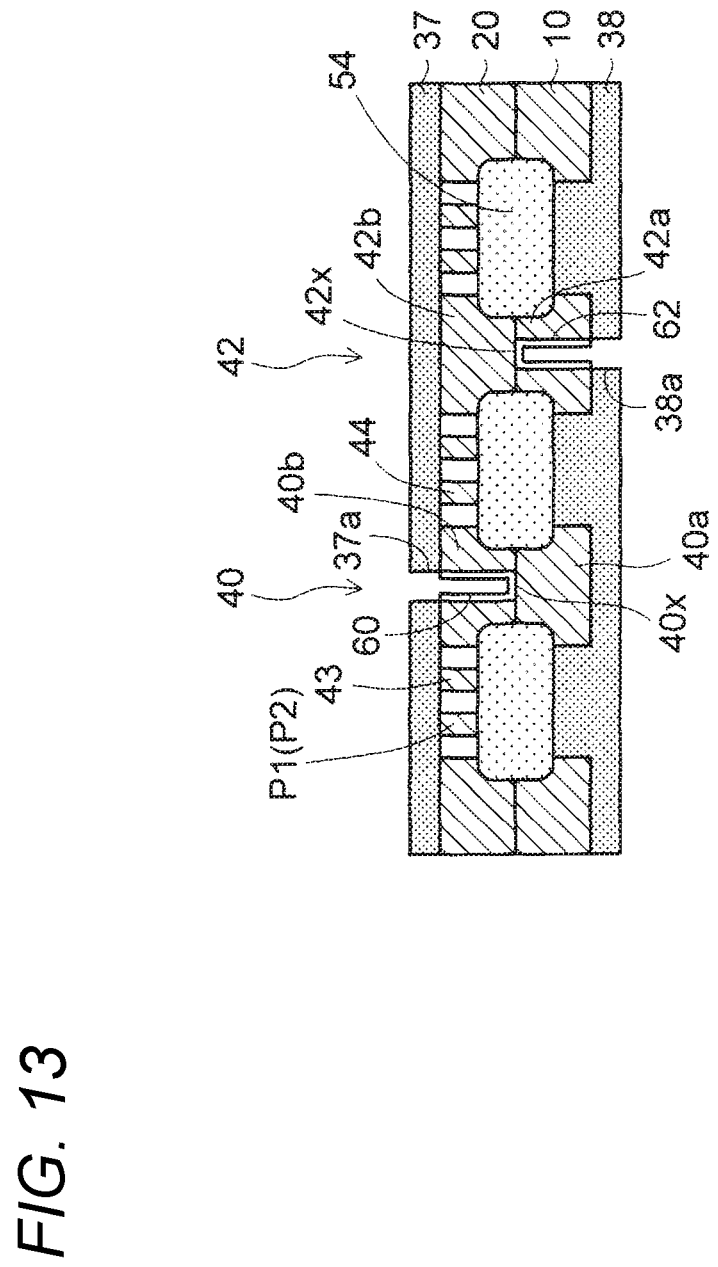
FIG. 13 is a sectional view (Part 13) showing the manufacturing method for the lead frame according to the first embodiment.

Next, as shown in FIG. 13, a first resist layer 37 provided with opening portions 37a on the recesses 40x of the first terminals 40 is formed on an upper surface of the structure body shown in FIG. 12 based on photolithography.

In addition, in the same manner, a second resist layer 38 provided with opening portions 38a on the recesses 42x of the second terminals 42 is formed on a lower surface of the structure body shown in FIG. 12 based on photolithography.

Further, electrolytic plating is performed using power feed wirings as power feed paths for the plating. The power feed wirings are connected to the first terminals 40 and the second terminals 42.

Thus, a first metal plating layer 60 (an example of the metal layer) is formed on inner surfaces of the recesses 40x of the first terminals 40 exposed in the opening portions 37a of the first resist layer 37. In addition, at the same time, a second metal plating layer 62 (an example of the metal layer) is formed on inner surfaces of the recesses 42x of the second terminals 42 exposed in the opening portions 38a of the second resist layer 38.

As each of the first metal plating layer 60 and the second metal plating layer 62, a monolayer film consisting of a copper (Cu) layer or a multilayer film, for example, consisting a nickel (Ni) layer/a palladium (Pd) layer/a gold (Au) layer or a nickel (Ni) layer/a gold (Au) layer sequentially from the lower side can be used.

Then, as shown in FIG. 14, the first resist layer 37 and the second resist layer 38 are removed from the structure body shown in FIG. 13.

In the aforementioned manner, a lead frame 1 according to the first embodiment can be manufactured.

A sectional view of FIG. 14 shows a peripheral portion of a die pad and a wiring region in one product region of the lead frame. In addition, the plan view of FIG. 15 shows an overall state of the one product region of the lead frame.

As shown in FIG. 14 and FIG. 15, the lead frame 1 according to the first embodiment is provided with the die pad 6 in its central portion. The die pad 6 is shaped like a square. As shown in FIG. 14, the die pad 6 is formed by placing the upper metal plate 20 on the lower metal plate 10.

Alternatively, the die pad 6 may be made up of only the lower metal plate 10. In this case, the upper metal plate 20 in a region corresponding to the die pad 6 may be etched simultaneously in the aforementioned step of FIG. 11 and FIG. 12.

The resin portion 54 is formed integrally in a peripheral region of the die pad 6. The resin portion 54 has an upper surface and a lower surface opposite to the upper surface.

In addition, the first terminals 40 are formed to penetrate the resin portion 54 in the peripheral region of the die pad 6.

As shown in FIG. 15, the first terminals 40 are connected to the first wiring portions 43 and the first pads P1. The first wiring portions 43 extend inward from the first terminals 40, and the first pads P1 are disposed in the vicinity of the circumference of the die pad 6. The first wiring portions 43 and the first pads P1 are formed on the resin portion 54.

In order to make illustration easy, the first terminals 40, the first wiring portions 43 and the first pads P1 are drawn separately in the sectional view of FIG. 14. In fact, the first terminals 40, the first wiring portions 43 and the first pads P1 are formed to be connected to one another, as shown in FIG. 15. The same thing can be applied to the second terminals 42, the second wiring portions 44 and the second pads P2 which will be described later.

As shown in FIG. 15, the first terminals 40 are disposed side by side in the peripheral region to surround the square die pad 6.

In addition, the second terminals 42 are formed to penetrate the resin portion 54 outside the first terminals 40. The second terminals 42 are connected to the second wiring portions 44 and the second pads P2. The second wiring portions 44 extend inward from the second terminals 42, and the second pads P2 are disposed in the vicinity of the circumference of the die pad 6. The second wiring portions 44 and the second pads P2 are formed on the resin portion 54.

Each first terminal 40 and a corresponding one of the first wiring portions 43 and a corresponding one of the first pad P1s which are connected to the first terminal 40 are disposed as an independent wiring route. Each second terminal 42, and a corresponding one of the second wiring portions 44 and a corresponding one of the second pads P2 which are connected to the second terminal 42 are disposed as an independent wiring route.

The first pads P1 and the second pads P2 are disposed side by side alternately in the vicinity of the circumference of the die pad 6. The second terminals 42 are disposed side by side in the region outside the first terminals 40 so as to surround the die pad 6.

Thus, the resin portion 54 is formed integrally in the peripheral region of the die pad 6, and the plurality of first terminals 40 and the plurality of second terminals 42 are disposed to penetrate the resin portion 54. The first pads P1 connected to the first terminals 40 through the first wiring portions 43 and the second pads P2 connected to the second terminals 42 through the second wiring portions 44 are disposed in the vicinity of the circumference of the die pad 6.

As will be described later, a semiconductor chip is mounted on the die pad 6, and the semiconductor chip is connected to the first pads P1 and the second pads P2 through wires.

As shown in FIG. 14, each of the first terminals 40 is formed by the first lower terminal portion 40a and the first upper terminal portion 40b which is disposed on the first lower terminal portion 40a. The first terminal 40 is provided with the recess 40x on the upper surface side. In FIG. 14, an example of the "one terminal portion" is the first upper terminal portion 40b disposed on the upper surface side, and an example of "the other terminal portion" is the first lower terminal portion 40a disposed on the lower surface side.

The first upper terminal portion 40b is disposed to be exposed on the upper surface side of the resin portion 54. In addition, the first lower terminal portion 40a is disposed to be exposed on the lower surface side of the resin portion 54.

The recess 40x provided in the first terminal 40 is formed so that an inner wall surface of the through hole T2 can be used as a side surface of the recess 40x and the first lower terminal portion 40a exposed from the through hole T2 can be used as the bottom of the recess 40x.

In addition, each of the second terminals 42 is formed by the second lower terminal portion 42a and the second upper terminal portion 42b which is disposed on the second lower terminal portion 42a. The second terminal 42 is provided with the recess 42x on the lower surface side. Also as for the second terminal 42, in the same manner, an example of the "one terminal portion" is the second upper terminal portion 42b, and an example of "the other terminal portion" is the second lower terminal portion 42a.

The recess 42x provided in the second terminal 42 is formed so that an inner wall surface of the through hole T1 can be used as a side surface of the recess 42x and the second upper terminal portion 42b exposed from the through hole T1 can be used as the bottom of the recess 42x.

As shown in FIG. 15, the doughnut-shaped first upper terminal portions 40b of the first terminals 40 are exposed and disposed on a front side of the lead frame 1 so as to surround the die pad 6. In addition, the second upper terminal portions 42b of the second terminals 42 are exposed and disposed in the region outside the first upper terminal portions 40b of the first terminals 40 so as to surround the die pad 6.

FIG. 16 is a plan view of the lead frame 1 in FIG. 15 as seen from a back side. As shown in FIG. 16, the first lower terminal portions 40a of the first terminals 40 are exposed from the resin portion 54 and disposed on a back side of the lead frame 1 so as to surround the die pad 6.

In addition, the doughnut-shaped second lower terminal portions 42a of the second terminals 42 are exposed from the resin portion 54 and disposed in the region outside the first lower terminal portions 40a of the first terminals 40 so as to surround the die pad 6.

Further, as shown in FIG. 14, the first metal plating layer 60 is formed on the inner surfaces of the recesses 40x on the upper surface sides of the first terminals 40. The first metal plating layer 60 is not embedded into the recesses 40x of the first terminals 40 but formed as a thin film along the inner surfaces of the recesses 40x. Thus, each of the recesses 40x becomes hollow.

In this manner, in the first terminals 40, the inner walls of the through holes T2 of the first upper terminal portions 40b and the upper surfaces of the first lower terminal portions 40a are electrically connected to each other respectively by the first metal plating layer 60.

In addition, in the same manner, the second metal plating layer 62 is formed on the inner surfaces of the recesses 42x on the lower surface sides of the second terminals 42.

The second metal plating layer 62 is not embedded into the recesses 42x of the second terminals 42 but formed as a thin film along the inner surfaces of the recesses 42x. Thus, each of the recesses 42x becomes hollow.

In this manner, in the second terminals 42, the inner walls of the through holes T1 of the second lower terminal portions 42a and the lower surfaces of the second upper terminal portions 42b are electrically connected to each other respectively by the second metal plating layer 62.

As described above, the first terminals 40 and the second terminals 42 are formed as through conductors through which the upper surface side and the lower surface side of the lead frame 1 can be electrically conductive to each other.

In the manufacturing method for the lead frame 1 according to the embodiment as described above, first, the upper metal plate 20 whose lower surface side has been machined is placed on the lower metal plate 10 whose upper surface side has been machined. Next, the resin portion 54 is formed in the cavity portion 12 between the lower metal plate 10 and the upper metal plate 20.

On this occasion, the lower metal plate 10 and the upper metal plate 20 which have come into direct contact with each other are firmly fixed to and integrated with each other by the resin portion 54 in the cavity portion 12.

Therefore, stress is not applied locally when the lower metal plate 10 and the upper metal plate 20 are firmly fixed to each other. Thus, residual stress can be suppressed. Accordingly, even when thin metal plates are used to form fine terminal portions or wiring portions at narrow pitches, deformation of the lead frame can be prevented. Consequently, the lead frame can be manufactured reliably.

In addition, the upper metal plate 20 and the lower metal plate 10 are patterned. Thus, the first terminals 40, the second terminals 42, and the first and second wiring portions 43 and 44 and the first and second pads P1 and P2 which are connected to the first and second terminals 40 and 42 are formed in the upper metal plate 20 and the lower metal plate 10.

In the embodiment, the thin bottom plate of the second recess C2 of the upper metal plate 20 is patterned. As a result, the first and second terminals 40 and 42, the first and second wiring portions 43 and 44, and the first and second pads P1 and P2 are formed in the thin bottom plate of the second recess C2 of the upper metal plate 20. Therefore, thinning of the patterns for wet-etching the metal plates can be reduced. Consequently, the terminals, the wiring portions and the pads can be formed with fine patterns.

In addition, in the first terminals 40, the first lower terminal portions 40a and the first upper terminal portions 40b are electrically connected to each other respectively by the first metal plating layer 60 formed on the inner surfaces of the recesses 40x.

In addition, in the same manner, in the second terminals 42, the second lower terminal portions 42a and the second upper terminal portions 42b are electrically connected to each other respectively by the second metal plating layer 62 formed on the inner surfaces of the recesses 42x.

Therefore, even when the lower metal plate 10 and the upper metal plate 20 are merely brought into contact with each other to be thereby placed on each other, the first terminals 40 and the second terminals 42 which have satisfactory electric conduction properties can be formed reliably.

Moreover, in the state in which the lower metal plate 10 and the upper metal plate 20 have been brought into direct contact with each other without using a bonding member such as an adhesive agent, the both are firmly fixed to each other by the resin portion 54.

Therefore, the first terminals 40 can also secure electric conductivity in portions where the first lower terminal portions 40a and the first upper terminal portions 40b make contact with each other. In addition, in the same manner, the second terminals 42 can also secure electric conductivity in portions where the second lower terminal portions 42a and the second upper terminal portions 42b make contact with each other.

In addition, not laser machining etc. but wet-etching is used for manufacturing the lower metal plate 10 and the upper metal plate 20. Accordingly, the cavity portion 12 where the resin portion 54 is formed can be formed reliably.

Thus, when the cavity portion 12 is filled with the resin, the resin can be prevented from leaking to form the resin portion 54 on the first and second terminals 40 and 42, the first and second wiring portions 43 and 44 and the first pads P1 and P2.

In the embodiment, the first and second terminals 40 and 42 are arranged in two rows in the peripheral region of the die pad 6. However, the number of rows of the terminals or the layout of the terminals can be set desirably.

In addition, in the example of FIG. 14, each first terminal 40 disposed on the inner side are provided with the recess 40x on the upper surface side and each second terminal 42 disposed on the outer side is provided with the recess 42x on the lower surface side. However, the recesses of the terminals may be disposed on one of the upper surface side and the lower surface side alternatively.

In addition, the wiring portions and the pads may be removed so that the upper surfaces of the terminals can be used as pads alternatively. In this case, all the terminals are preferably formed to include the recesses provided on the lower surface side.

Next, a manufacturing method for an electronic component device using the aforementioned lead frame 1 shown in FIG. 14 and FIG. 15 will be described.

The aforementioned upper surface of the lead frame 1 in FIG. 14 is a surface on which an electronic component is to be mounted. The lower surface of the lead frame 1 is a surface which faces a wiring board (mount board) such as a motherboard.

As shown in FIG. 17, first, a semiconductor chip 70 provided with connection terminals 72 is prepared. The semiconductor chip 70 in which the connection terminals 72 are disposed to face up is fixed and mounted on the die pad 6 of the lead frame 1 by an adhesive agent (not shown).

On this occasion, the semiconductor chip 70 is mounted on the aforementioned die pad 6 in the plan view of FIG. 15. Peripheral portions of the die pad 6 and the semiconductor chip 70 and the wiring region of the lead frame 1 are shown in a sectional view of FIG. 17.

The semiconductor chip 70 is an example of the electronic component. However, various electronic components can be mounted on the die pad 6 of the lead frame 1.

Successively, also as shown in FIG. 17, the connection terminals 72 of the semiconductor chip 70 are connected to the first pads P1 and the second pads P2 of the lead frame 1 through wires W by a wire bonding method.

The semiconductor chip 70 is electrically connected to the first terminals 40 through the wires W, the first pads P1 and the first wiring portions 43. In addition, the semiconductor chip 70 is electrically connected to the second terminals 42 through the wires W, the second pads P2 and the second wiring portions 44.

Further, as shown in FIG. 18, a sealing resin 74 is formed on the lead frame 1 to seal the semiconductor chip 70 and the wires W. The recesses 40x provided in the first upper terminal portions 40b (one terminal portions) of the first terminals 40 are filled with the sealing resin.

Then, the lead frame 1 is cut and separated into an individual piece in order to obtain each individual product region. Thus, an electronic component device 2 is obtained.

In the aforementioned manner, the electronic component device 2 according to the embodiment can be manufactured, as shown in FIG. 18.

FIG. 19 shows an example in which a copper layer is used as each of the first and second metal plating layers 60 and 62 of the lead frame 1.

In this example, solders 64 are formed respectively on lower surfaces of the first terminals 40 and the second terminals 42 by electrolytic plating in which the power feed wirings connected to the first terminals 40 and the second terminals 42 are used as power feed paths for the plating.

Thus, the recesses 42x provided in the second lower terminal portions 42a of the second terminals 42 are filled with the solders 64. Then, the solders 64 on the lower surfaces of the first and second terminals 40 and 42 of the electronic component device 2 are connected to a mount board such as a motherboard.

Alternatively, when an Ni layer/a Pd layer/an Au layer (or an Ni layer/an Au layer) are used as each of the first and second metal plating layers 60 and 62, the electronic component device 2 may be connected to the mount board such as the motherboard in a state in which the recesses 42x of the second terminals 42 are hollow. In this case, the recesses 42x of the second terminals 42 can be filled with solders formed on the mount board side.

When the recesses 42x on the lower surface sides of the second terminals 42 of the lead frame 1 are filled with the solders 64, the upper surface side and the upper surface side can be electrically conductive to each other more stably.

Second Embodiment

Figure 20A:
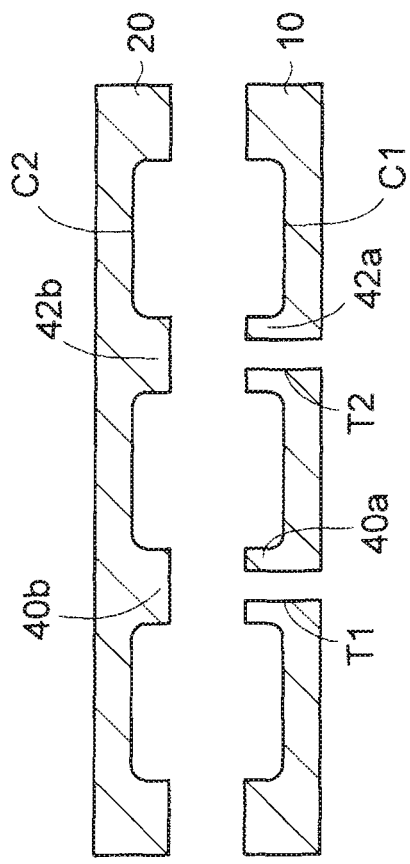
FIGS. 20A and 20B are sectional views showing a manufacturing method for a lead frame according to a second embodiment.
Figure 20B:
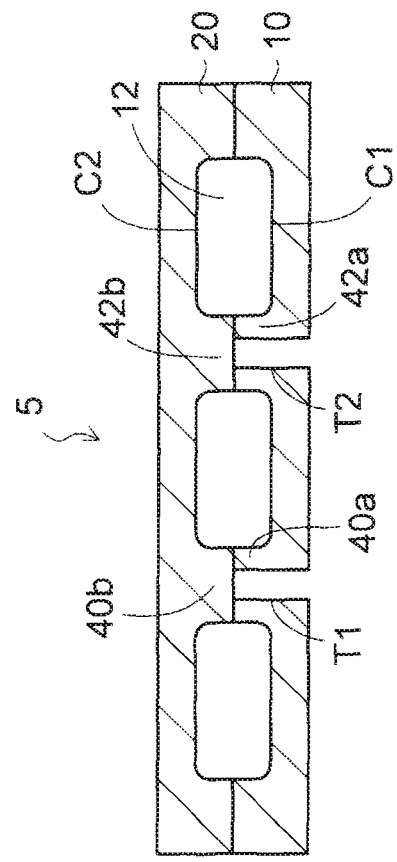
Figure 21:
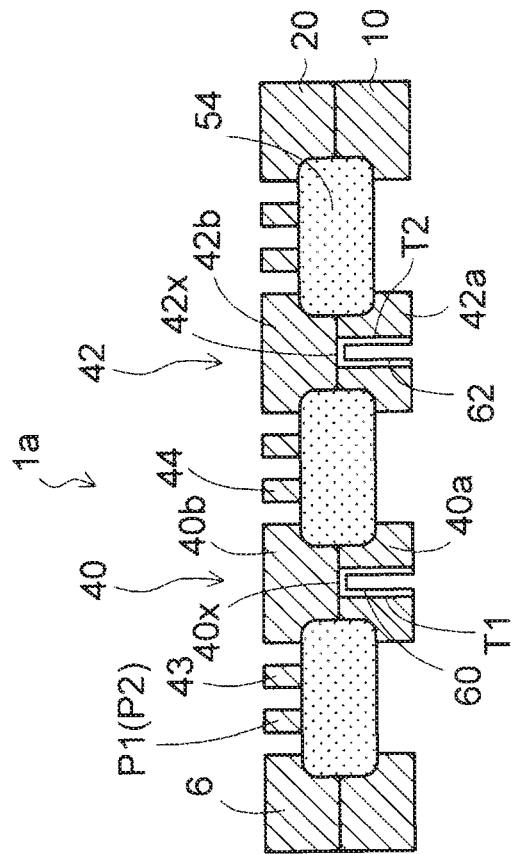
FIG. 21 is a sectional view showing the lead frame according to the second embodiment.

FIGS. 20A and 20B are views for explaining a manufacturing method for a lead frame according to a second embodiment. FIG. 21 is a view showing the lead frame according to the second embodiment.

In the second embodiment, both first terminals and second terminals are provided with recesses on a lower surface side.

As shown in FIG. 20A, in a lower metal plate 10, a through hole T1 is formed at each of first lower terminal portions 40a and a through hole T2 is formed at each of second lower terminal portions 42a in the aforementioned step of FIGS. 6A and 6B in the first embodiment.

In the second embodiment, each of the first lower terminal portion 40a and the second lower terminal portion 42a in the lower metal plate 10 is formed into a doughnut shape in plan view.

In addition, in an upper metal plate 20, no through hole is formed at any of first upper terminal portions 40b and second upper terminal portions 42b so that each of the first upper terminal portions 40b and the second upper terminal portions 42b is formed like an island.

As shown in FIG. 20B, the first upper terminal portion 40b and the second upper terminal portion 42b of the upper metal plate 20 are placed on the first lower terminal portion 40a and the second lower terminal portion 42a of the lower metal plate 10 so as to be aligned therewith respectively.

Next, the same steps as the aforementioned steps of FIGS. 7 to 13 are performed on a structure body in FIG. 20B. Thus, a lead frame 1a according to the second embodiment is obtained, as shown in FIG. 21.

The lead frame 1a according to the second embodiment is different from the lead frame 1 in FIG. 14 according to the first embodiment in that the first terminal 40 and the second terminal 42 are provided with a recess 40x and a recess 40y respectively on the lower surface side. The other elements of the lead frame 1a according to the second embodiment are the same as the lead frame 1 in FIG. 14 according to the first embodiment. In the second embodiment, the through holes are formed at all the lower terminal portions (the other terminal portions) of the terminals, and all the terminals are provided with the recesses on the lower surface side.

The lead frame 1a according to the second embodiment can obtain the same effects as the lead frame 1 according to the first embodiment.

Further, since all the terminals are provided with the recesses on the lower surface side in the second embodiment, the lead frame can be connected to a mount board in a state in which all the recesses of the terminals are filled with solders. Thus, reliability of electric conduction of all the terminals of the lead frame can be improved.

In the same manner as in the aforementioned FIG. 19, an electronic component device can be also formed using the lead frame 1a according to the second embodiment. The recesses provided at the lower terminal portions (the other terminal portions) of the terminals in the lead frame 1a according to the second embodiment are filled with the solders.

Third Embodiment

Figure 22A:
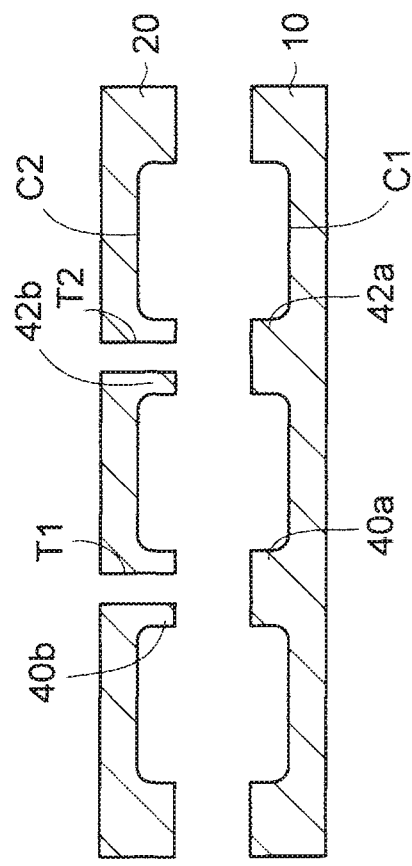
FIGS. 22A and 22B are sectional views showing a manufacturing method for a lead frame according to a third embodiment.
Figure 22B:
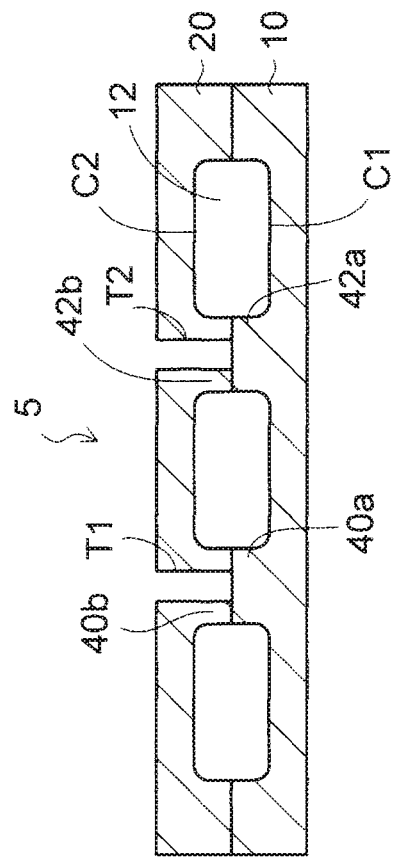
Figure 23:
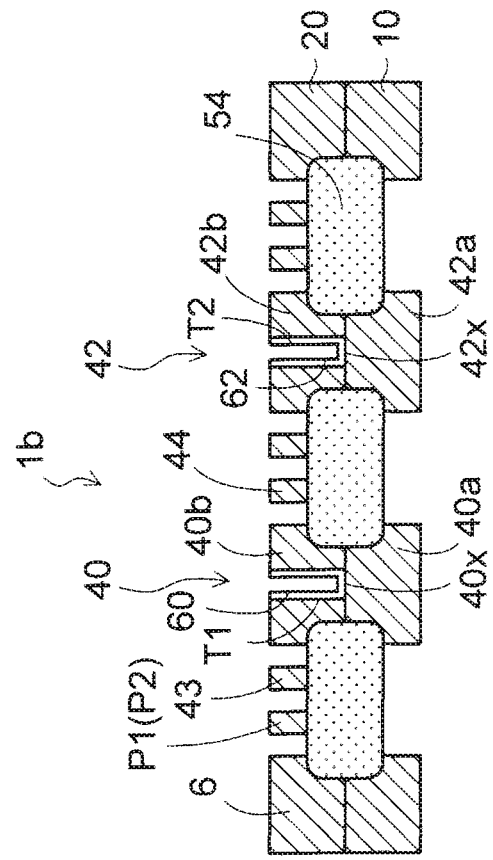
FIG. 23 is a sectional view showing a lead frame according to a third embodiment.

FIGS. 22A and 22B are views for explaining a manufacturing method for a lead frame according to a third embodiment. FIG. 23 is a view showing the lead frame according to the third embodiment.

In the third embodiment, both first terminals and second terminals are provided with recesses on an upper surface side.

As shown in FIG. 22A, in a lower metal plate 10, no through hole is formed at any of first lower terminal portions 40a and second lower terminal portions 42a in the aforementioned step of FIGS. 6A and 6B according to the first embodiment.

In an upper metal plate 20, a through hole T1 is formed at each of first upper terminal portions 40b and a through hole T2 is formed at each of second upper terminal portions 42b.

As shown in FIG. 22B, the first upper terminal portion 40b and the second upper terminal portion 42b of the upper metal plate 20 are placed on the first lower terminal portion 40a and the second lower terminal portion 42a of the lower metal plate 10 so as to be aligned therewith respectively.

Next, the same steps as the aforementioned steps of FIGS. 7 to 13 are performed on a structure body in FIG. 22B. Thus, a lead frame 1b according to the third embodiment is obtained, as shown in FIG. 23.

The lead frame 1b according to the third embodiment is different from the lead frame 1 in FIG. 14 according to the first embodiment in that the first terminal 40 and the second terminal 42 are provided with a recess 40x and a recess 42x respectively on the upper surface side. The other elements of the lead frame 1b according to the third embodiment are the same as those of the lead frame 1 in FIG. 14 according to the first embodiment. In the third embodiment, the through holes are formed at all the upper terminal portions (one terminal portions) of the terminals, and all the terminals are provided with the recesses on the upper surface side.

The recesses 40x and 42x on the upper surface side of the first terminals 40 and the second terminals 42 may be filled with solders. In this case, the solders are filled in the recesses 40x and 42x on the upper surface side of the first terminals 40 and the second terminals 42 by electrolytic plating before a semiconductor chip 70 is mounted on a die pad 6.

In addition, the solders may be formed on lower surfaces of the first terminals 40 and the second terminals 42.

The lead frame 1b according to the third embodiment can obtain the same effects as the lead frame 1 according the first embodiment.

In the same manner as in the aforementioned FIG. 19, an electronic component device can be also formed using the lead frame 1b according to the third embodiment. In the third embodiment, the recesses provided at the upper terminal portions (one terminal portions) of the terminals may be filled with a sealing resin.

Fourth Embodiment

Figure 24:
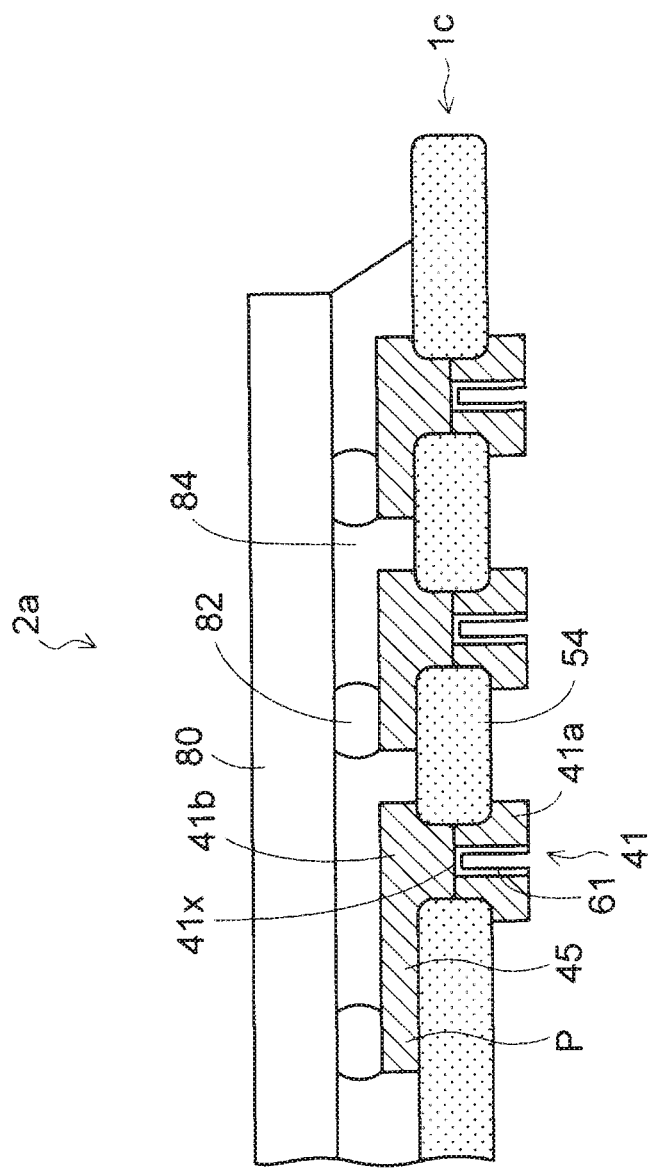
FIG. 24 is a sectional view showing an electronic component device using a lead frame according to a fourth embodiment.

FIG. 24 is a view for explaining an electronic component device 2a according to a fourth embodiment. A lead frame 1c in FIG. 24 is used in an application for flip-clip connecting a semiconductor chip.

In the lead frame 1c in FIG. 24, no die pad is provided but pads P of wiring portions 45 connected to terminals 41 are disposed on a resin portion 54 correspondingly to bump electrodes 82 of a semiconductor chip 80. Alternatively, the wiring portions 45 and the pads P may be removed so that upper surfaces of the terminals 41 can be used as pads.

The bump electrodes 82 of the semiconductor chip 80 are flip-chip connected to the pads P of the lead frame 1c through solders.

Further, a space between the semiconductor chip 80 and the lead frame 1c is filled with an underfill resin 84.

In the same manner as that according to any of the aforementioned first to third embodiments, each of the terminals 41 is formed by disposing an upper terminal portion 41b on a lower terminal portion 41a. In the example of FIG. 24, all the terminals 41 are provided with recesses 41x on a lower surface side, and a metal plating layer 61 is formed on inner surfaces of the recesses 41x.

As described in the aforementioned first to third embodiments, the recess 41x on the lower surface side of each of the terminals 41 can be filled with a solder before or when the electronic component device 2a is connected to a mount board such as a motherboard. Thus, electric conduction between the electronic component device 2a and the mount board can be obtained more stably.

Terminals provided with recesses on an upper surface side and terminals provided with recesses on a lower surface side may be disposed in mixture as in the first embodiment.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing a lead frame comprising:
a) forming a first recess in a first metal plate to form a first terminal portion, and forming a through hole in the first terminal portion;
b) forming a second recess in a second metal plate to form a second terminal portion (42b);
c) disposing the second metal plate on the first metal plate such that the first terminal portion and the second terminal portion face each other;
d) filling a resin in a cavity portion formed by the first recess and the second recess to thereby form a resin portion;
e) patterning the first metal plate and the second metal plate to form a terminal that comprises the first terminal portion and the second terminal portion, wherein a third recess defined by the through hole and a surface of the second terminal portion is formed in the terminal; and
f) forming a metal layer on an inner surface of the third recess.

What is claimed is:

1. A lead frame comprising:
a resin portion comprising an upper surface and a lower surface opposite to the upper surface; and
a first terminal formed to penetrate the resin portion, wherein the first terminal comprises:
a first upper terminal portion disposed to protrude from the upper surface;
a first lower terminal portion disposed on the first upper terminal portion to protrude from the lower surface;
a first through hole formed in one of the first upper terminal portion and the first lower terminal portion;
a first recess defined by an inner wall surface of the first through hole and a surface of the other of the first upper terminal portion and the first lower terminal portion; and
a first metal layer formed on an inner surface of the first recess.

2. The lead frame according to claim 1, further comprising:
a second terminal formed to penetrate the resin portion, wherein the second terminal comprises:
a second upper terminal portion disposed to protrude from the upper surface;
a second lower terminal portion disposed on the second upper terminal portion to protrude from the lower surface;
a second through hole formed in one of the second upper terminal portion and the second lower terminal portion;
a second recess defined by an inner wall surface of the second through hole and a surface of the other of the second upper terminal portion and the second lower terminal portion; and
a second metal layer formed on an inner surface of the second recess.

3. The lead frame according to claim 1, wherein
the first terminal comprises a plurality of first terminals,
the lead frame further comprises a die pad on which an electronic component is to be mounted; and
the plurality of first terminals are disposed to surround the die pad.

4. The lead frame according to claim 2, wherein
an electronic component is to be mounted on an upper surface of the lead frame,
the first through hole is formed in the first upper terminal portion,
the second through hole is formed in the second lower terminal portion, and
a solder is filled in the second recess.

5. The lead frame according to claim 2, wherein
an electronic component is to be mounted on an upper surface of the lead frame,
the first through hole is formed in the first lower terminal portion, and
the second through hole is formed in the second lower terminal portion.

6. The lead frame according to claim 2, wherein
an electronic component is to be mounted on an upper surface of the lead frame,
the first through hole is formed in the first upper terminal portion, and
the second through hole is formed in the second upper terminal portion.

7. An electronic component device comprising:
a lead frame comprising:
a resin portion comprising an upper surface and a lower surface opposite to the upper surface; and
a first terminal formed to penetrate the resin portion;

wherein the first terminal comprises:
a first upper terminal portion disposed to protrude from the upper surface;
a first lower terminal portion disposed on the first upper terminal portion to protrude from the lower surface;
a first through hole formed in one of the first upper terminal portion and the first lower terminal portion;
a first recess defined by an inner wall surface of the first through hole and a surface of the other of the first upper terminal portion and the first lower terminal portion; and
a first metal layer formed on an inner surface of the first recess, and
an electronic component mounted on the lead frame to be electrically connected to the first terminal.

8. The electronic component device according to claim 7, wherein the lead frame further comprises a second terminal formed to penetrate the resin portion, and
the second terminal comprises:
a second upper terminal portion disposed to protrude from the upper surface;
a second lower terminal portion disposed on the second upper terminal portion to protrude from the lower surface;
a second through hole formed in one of the second upper terminal portion and the second lower terminal portion;
a second recess defined by an inner wall surface of the second through hole and a surface of the other of the second upper terminal portion and the second lower terminal portion; and
a second metal layer formed on an inner surface of the second recess.

9. The electronic component device according to claim 8, further comprising:
a sealing resin that seals the electronic component, wherein:
the electronic component is mounted on an upper surface of the lead frame;
the first through hole is formed in the first upper terminal portion;
the second through hole is formed in the second lower terminal portion; and
the sealing resin is filled in the first recess and a solder is filled in the second recess.

10. The electronic component device according to claim 8, wherein:
the electronic component is mounted on an upper surface of the lead frame;
the first through hole is formed in the first lower terminal portion;
the second through hole is formed in the second lower terminal portion; and
a solder is filled in each of the first recess and the second recess.

11. The electronic component device according to claim 8, further comprising:
a sealing resin that seals the electronic component, wherein:
the electronic component is mounted on an upper surface of the lead frame;
the first through hole is formed in the first upper terminal portion;
the second through hole is formed in the second upper terminal portion; and
the sealing resin is filled in each of the first recess and the second recess.

* * * * *